(12) United States Patent
Ando

(10) Patent No.: US 6,391,702 B1
(45) Date of Patent: May 21, 2002

(54) METHOD OF MANUFACTURE FOR SEMICONDUCTOR DEVICES

(75) Inventor: Masateru Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/698,807

(22) Filed: Oct. 27, 2000

(30) Foreign Application Priority Data

Oct. 29, 1999 (JP) ............................................. 11-310199

(51) Int. Cl.[7] .......................................... H01L 21/8242
(52) U.S. Cl. ..................... 438/241; 438/200; 438/210; 438/231
(58) Field of Search ............................... 438/199, 200, 438/210, 231, 241

(56) References Cited

U.S. PATENT DOCUMENTS

| 5,624,863 A | * | 4/1997 | Helm et al. | 438/210 |
| 5,976,939 A | * | 11/1999 | Thompson et al. | 438/305 |
| 5,981,321 A | * | 11/1999 | Chao | 438/199 |

FOREIGN PATENT DOCUMENTS

| JP | 62-69560 | 3/1987 |
| JP | 3-62573 | 3/1991 |
| JP | 3-145136 | 6/1991 |
| JP | 8-330331 | 12/1996 |
| JP | 2670265 | 7/1997 |

* cited by examiner

*Primary Examiner*—Carl Whitehead, Jr.
*Assistant Examiner*—Toniae M. Thomas
(74) *Attorney, Agent, or Firm*—Darryl G. Walker

(57) ABSTRACT

A method of manufacturing a semiconductor device that can limit etch damage is disclosed. According to one embodiment, isolation regions (102) may be formed in a substrate (101). A word line (103) may be formed in a first region. A protective film (105) may be formed over the first region and a second region. A protective film (105) may then be etched from the second region but retained in the first region. A sidewall layer (107) may then be formed over the first and second regions, and etched to form sidewalls (107-*a*). The protective film (105-*a*) over the first region can reduce etch damage. Further, because a protective film (105-*a*) can be thinner than a sidewall layer (107), a resulting step height between the first region and second region may be reduced. Reductions in such a step height can result in better focus margins for subsequent photolithographic steps.

20 Claims, 2 Drawing Sheets

METHOD OF MANUFACTURE FOR SEMICONDUCTOR DEVICES

TECHNICAL FIELD

The present invention relates generally to the manufacture of semiconductor devices, and more particularly to methods of manufacturing semiconductor devices that can limit etch damage and/or provide improved lithography focus margin.

BACKGROUND OF THE INVENTION

In many semiconductor devices, a substrate may include different regions having different tolerances to certain process steps. As but one example, a semiconductor memory device, such as dynamic random access memory (DRAM), may include a memory cell region that can be separate from peripheral regions. During manufacturing, a memory cell region may experience damage from etching. Etching damage may cause deterioration of circuit characteristics in a memory cell region. As but one example, DRAM memory cell device hold characteristics can deteriorate from etching damage. Device hold characteristics can indicate how long a memory cell can retain a particular logic value.

Various conventional approaches have been proposed to address etching damage to selected portions of a semiconductor device while maintaining a stable and high-throughput process. A first example of art related to such manufacturing processes will now be described with reference to FIGS. 5 to 7. FIGS. 5 to 7 show side cross sectional view of a manufacturing process for a semiconductor memory device having a peripheral circuit region (PERIPHERAL CIRCUIT REGION) and a memory cell region (MEMORY CELL REGION).

Referring now to FIG. 5, a conventional semiconductor manufacturing process may include forming a field oxidation film 002 in a p-type silicon substrate 001. A field oxidation film 002 may separate active region in a p-type substrate 001 from one another. A gate oxidation film (not shown) may also be formed over a substrate 001. A word line 003 comprising polycrystalline silicon may then be formed on a gate oxidation film.

Referring again to FIG. 5, an n-type diffusion layer 004 can then be formed in the substrate 001 on the sides of a word line 003. Such an n-type diffusion layer 004 may include lightly doped diffusion (LDD) regions.

Referring now to FIG. 6, an oxide layer 005 may be deposited over a semiconductor substrate 001, including over diffusion layer 004 and word line 003. An oxide layer 005 can be used to form a sidewall in a peripheral circuit region, and protect a substrate in memory cell region from etch damage. An oxide layer 005 may be formed from well-known techniques, such as high temperature oxide (HTO), and the decomposition of tetraethylorthosilicate (TEOS) to form non-doped silicate glass (NSG), etc. Further, an oxide layer 005 may be deposited to a thickness of approximately 1500 to 2000 angstroms.

FIG. 6 also shows the formation of an etch mask from photoresist 006. A photoresist etch mask 006 may cover a memory cell region and expose a peripheral circuit region.

Referring to FIG. 7, a semiconductor substrate may then be etched with dry etching (anisotropic etching). Such etching can form sidewalls 005-b in a peripheral circuit region. However, due to a photoresist etch mask 006, sidewalls are not formed in a memory cell region.

FIG. 7 also shows the formation of an n-channel and/or p-channel diffusion layers 007. N-channel and/or p-channel diffusion layers 007 may be formed sequentially with photolithographic techniques and ion implantation. Ion implantation may include the implantation of n-type and p-type dopants, for example, arsenic and difluoroborane ($BF_2$), etc. In this way, transistors may be formed in a semiconductor device.

A drawback to various conventional approaches can be added complexity due to narrow focus margins involved in small geometry photolithographic steps. More particularly, if reference is made back to FIG. 7, following the formation of sidewalls 005-b in a peripheral circuit region, an oxide layer 005-a may be formed over a memory cell region. An oxide layer 005-a may have a step height, shown as "B," that is essentially the thickness of a sidewall 005-b. Thus, an oxide layer 005-b may result in a difference in height between a peripheral circuit region and a memory cell region. Such a height difference can reduce focus margins for subsequent photolithography and etch steps. Consequently, to increase focus margins, a conventional approach may include subsequent deposition steps accompanied by chemical-mechanical polishing (CMP). While CMP steps can provide a more level surface, such steps can undesirably increase the number of steps in an overall manufacturing process.

Another example of related art is described in Japanese Laid Open Patent Application (Kokai) 03-062573 titled MIS SEMICONDUCTOR DEVICE MANUFACTURING METHOD. In Kokai 03-062573, n-type diffusion regions and gates may be formed on a substrate. A layer of spin-on-glass (SOG) and a sidewall silicon dioxide film may then be deposited. It is noted that in Kokai 03-062573, a semiconductor device includes a dense metallization region (which can correspond to a memory cell region) and a sparse metallization region (which can correspond to a peripheral region). SOG in combination with a sidewall silicon dioxide film may result in an overall silicon dioxide/SOG film thickness that is the same in both the dense and sparse metallization region. This can reduce etch damage as theoretically, the substrate can be exposed as essentially the same time in both the sparse metallization region and the dense metallization region.

Kokai 03-062573 goes on to describe forming n-channel and p-channel transistors in a self-aligned fashion with photolithographic and ion implantation steps.

Kokai 03-062573 thus illustrates reduction in etch damage to a substrate resulting from a sidewall etch step by forming a sidewall layer with uniform thickness in all regions of a semiconductor device.

A drawback to the second example of Kokai 03-062573 can be that in many cases, despite essentially uniform sidewall layer coverage, etching damage may still occur. Etching damage may occur because actual etch rates may vary over a wafer surface. Further, such variations in etch rates can be greater for larger wafers, which can be preferable for economic reasons.

A third example of related art is described in Japanese Laid Open Patent Application 62-069560 titled MANUFACTURING METHOD FOR SEMICONDUCTOR DEVICES. In Kokai 62-069560, gates may be formed on a semiconductor substrate that may then be oxidized to form an oxidation layer. An N-diffusion region can then be formed by ion implantation. A silicon nitride film may then be formed over the surface of a semiconductor substrate. A silicon dioxide film may be formed over the silicon nitride film. When the silicon dioxide film is etched to form sidewall, the silicon nitride film can protect the substrate from etch damage.

Kokai 62-069560 thus illustrates reduction in etch damage to a substrate resulting from a sidewall etch step by forming a silicon nitride layer below a sidewall layer. A similar example of related art is shown in Japanese Laid Open Patent Application 8-330331.

One drawback to the approach of Kokai 62-069560 can be the resulting transistor properties. More particularly, in many cases it can be desirable to perform a hydrogen anneal that can reduce charge trap potential at a semiconductor surface. By forming an initial silicon dioxide layer over the surface, the effects of such a hydrogen anneal are reduced. A second drawback can be increased leakage of such a structure. A silicon nitride film may increase mechanical stress, resulting in greater leakage.

A fourth example of related art is described in Japanese Laid Open Patent Application 3-145136 titled MOS SEMICONDUCTOR DEVICE AND SIDEWALL FORMING METHOD THEREOF. In Kokai 3-145136, a sidewall layer may be a layered structure of different substances. The different substances can have an etch rate differential with respect to one another. Thus, when the sidewall layer is etched to form sidewalls, such an etch differential can result in a material protecting a substrate from etch damage.

It is noted that the fourth example results in a sidewall structure formed from two different materials.

A fifth example of related art is described in Japanese Patent No. 2670265 titled MANUFACTURING METHOD FOR CMOS SEMICONDUCTOR DEVICES. Japanese Patent No. 2670265 shows a semiconductor device having a complementary metal oxide semiconductor (CMOS) arrangement. In a sidewall forming etch step, a p-channel transistor diffusion layer can be prevented from being overetched, which can increase resistance. An object of Japanese Patent No. 2670265 is to prevent a decrease in the electrical current drive capability of transistors.

The fifth example appears to have a different object than the present invention in that an insulating film protects transistors in a peripheral p-channel region from overetch. This is different than the problem addressed by the present invention, which seeks to protect a memory cell region from damage when a peripheral region is etched. Such memory cell regions typically include n-channel transistors.

In light of the above discussion, it would be desirable to arrive at a semiconductor device manufacturing method that can protect a higher density region (e.g., memory cell region) from overetch when sidewalls are formed in a lower density region (e.g., peripheral region). At the same time, such a method should provide for increased focus margins for photolithographic steps, or the like.

SUMMARY OF THE INVENTION

According to the present invention, a method of manufacturing a semiconductor apparatus may include forming an isolation region in a semiconductor substrate and forming a gate over a first region. A protective film may then be formed over the first region and a second region. The protective film over the second region may then be removed by isotropic etching. A sidewall layer may be formed over the first and second regions, and then etched to form sidewalls. The protective film over the first region can protect the first region from etch damage. Further, because a protective film may be thinner than a sidewall layer, a step height between a first region and a second region can be reduced. This can result in greater focus margins than conventional approaches and related art.

According to one aspect of the invention, a protective film may have a thickness in the range of 400 to 500 angstroms.

According to another aspect of the invention, a protective film and sidewall layer may be formed separately.

According to another aspect of the invention, focus margins for lithography steps following the formation of gate sidewalls may be improved without chemical-mechanical polishing.

DETAILED DESCRIPTION OF THE EMBODIMENTS

Various embodiments of the present invention will now be described in detail with reference to a number of drawings.

An embodiment of the present invention will now be described with reference to FIGS. 1–4. FIGS. 1–4 are side cross sectional views of a semiconductor device that may include two regions. A first region may be sensitive to substrate etch damage and can be protected from etch damage when sidewalls are formed in a second region. A second region may correspond to a peripheral region of a semiconductor memory device. A first region may correspond to a memory cell region of a semiconductor memory device. More particularly, FIGS. 1–4 show various manufacturing steps for a dynamic random access memory (DRAM) having a memory cell region and peripheral circuit region.

Figure 1:
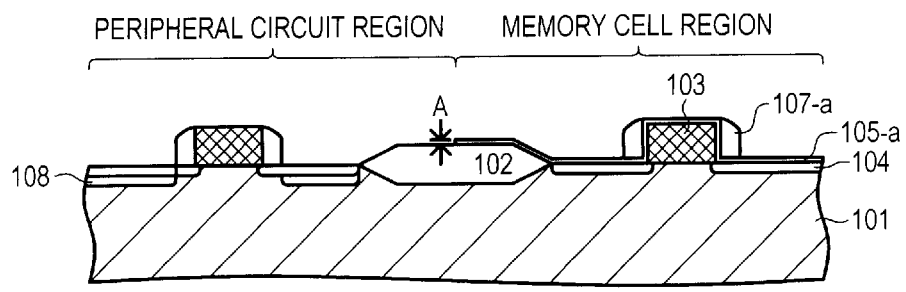
FIGS. 1 to 4 are side cross sectional views of one embodiment of the present invention.

Referring now to FIG. 1, a semiconductor device according to an embodiment of the present invention may include a semiconductor substrate 101 that includes an isolation region 102. In the view of FIG. 1 an isolation region 102 may separate a first dense feature region (MEMORY CELL REGION) and a second, less dense region (PERIPHERAL CIRCUIT REGION). A gate may be formed in a PERIPHERAL CIRCUIT REGION that includes sidewalls. A word line 103 may be formed in a MEMORY CELL REGION adjacent to first diffusion regions 104. First diffusion regions 104 may include lightly doped diffusion regions (sometimes referred to as lightly doped drains) (LDD).

Unlike conventional and related art, a semiconductor device according to an embodiment may include a protective film 105-*a*. A protective film 105-*a* may protect a substrate 101 in a MEMORY CELL REGION from etch damage when sidewalls are formed by a sidewall etch step. As shown in FIG. 1, a protective film 105-*a* may result in a step height difference, shown as "A," between a MEMORY CELL REGION and a PERIPHERAL CIRCUIT REGION. In one particular arrangement, a protective film 105-*a* may have a thickness in the general range of 400 to 500 angstroms. A word line 103 sidewall may be a multi-layered structure including a protective film 105-*a* and an insulating film 107-*a*. Second diffusion regions 108 may also be formed in a semiconductor substrate 101.

A structure such as that shown in FIG. 1 can provide etch protection in a memory cell region, while at the same time, improve focus margins for subsequent lithography steps. Etch protection, as noted above, can be provided by protective film 105-*a* formed over the substrate in the MEMORY CELL REGION. Improved focus margins can result from the relatively small step height introduced by a protective film 105-*a*.

Having described a general semiconductor device structure with reference to FIG. 1, a method of manufacturing a semiconductor device according to one embodiment will now be described with reference to FIGS. 1–4.

Figure 2:
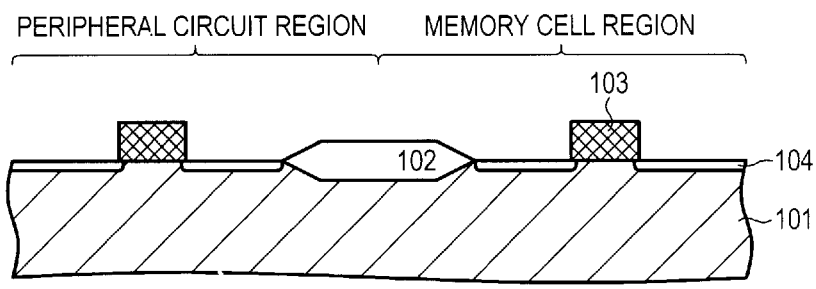

Referring now to FIG. 2, a method of manufacturing a semiconductor device according to one embodiment may include forming an isolation region 102 in a semiconductor substrate 101. An isolation region 102 may isolate active areas from one another. In the particular example of FIGS. 1–4, an isolation region 102 may separate a MEMORY CELL REGION from a PERIPHERAL CIRCUIT REGION. An isolation region may preferably be formed by a local oxidation of silicon (LOCOS) method to a thickness of about 4000 angstroms.

A method according to one embodiment may further include forming a gate insulator (not shown) over a semiconductor substrate 101. In one particular arrangement, a gate insulator may comprise silicon dioxide formed by heat oxidizing a silicon substrate 101 surface. A gate insulator may have a thickness of about 120 angstroms.

A method according to one embodiment may continue by forming a gate layer over gate insulator. In one particular arrangement, a gate layer may comprise polycrystalline and/or amorphous silicon (polysilicon) deposited to a thickness of about 2000 angstroms.

A deposited gate layer may then be patterned to form various gate and interconnecting structures. Such a patterning step may form a word line 103 in a MEMORY CELL REGION. In one arrangement, patterning a gate layer may include conventional photolithography and etch steps. Still further, forming a word line 103 may include an etch having a high enough degree of selectivity between a gate layer material and a gate insulator material to form a gate structure (e.g., a word line) while maintaining a gate insulator thickness of about 10–30 angstroms in exposed areas. Such an etch selectivity can protect a substrate in a MEMORY CELL REGION from etch damage when gate structures are formed.

Following the formation of gate structures (including word line 103), a first diffusion region 104 may be formed in a substrate 101. In one particular arrangement, first diffusion regions 104 may be formed by ion implantation of dopants. More particularly, an n-type dopant, such as phosphorous may be ion implanted with a word line 103 and isolation region 102 serving as a mask. In this way, self-aligned N- lightly-doped diffusion (LDD) regions may be formed.

Figure 3:
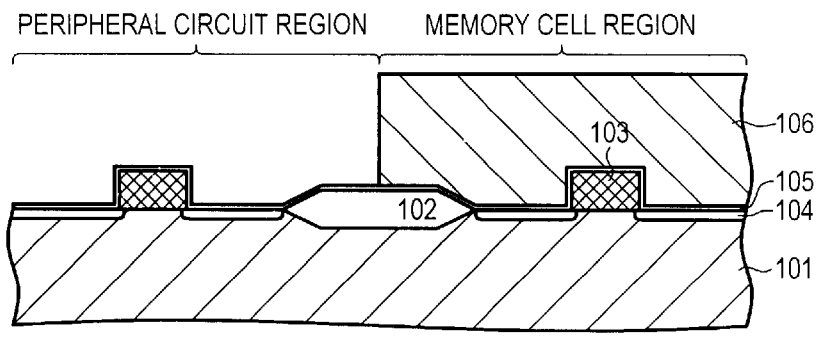

Referring now to FIG. 3, a relatively thin protective film 105 may be deposited over a surface of a semiconductor substrate 101. As will be described at a later point herein, a thin protective film 105 may protect the surface of a substrate 101 in a MEMORY CELL REGION. In one particular arrangement, a thin protective film 105 may be formed from silicon dioxide deposited to a thickness of about 400 to 500 angstroms.

As also shown in FIG. 3, an etch mask 106 may be formed that covers a MEMORY CELL REGION and exposes a PERIPHERAL CIRCUIT REGION. An etch mask 106 may be formed from photoresist using conventional photolithographic techniques.

Figure 4:
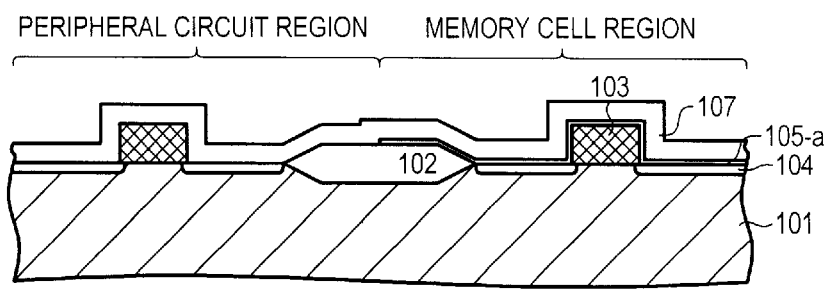

Referring now to FIG. 4, portions of a protective film 105 that are exposed by etch mask 106 may be removed. Consequently, a first region protective film 105-*a* may be formed. Removing a protective film 105 may include isotropically etching silicon dioxide with a wet chemical etch, such as a buffered oxide etch.

A sidewall layer 107 may then be deposited over a semiconductor substrate 101. In one particular arrangement, a sidewall layer 107 may include an insulating film deposited to a thickness of about 1500 to 2000 angstroms. Further, a sidewall layer 107 may comprise silicon dioxide. Such a silicon dioxide layer may be deposited with high temperature oxide (HTO) techniques. Silicon dioxide may also comprise non-doped silicon glass (NSG) formed by the decomposition of tetraethylorthosilicate (TEOS).

It is noted in one arrangement, a protective film 105 and sidewall film 107 may both comprise silicon dioxide.

Figure 7:
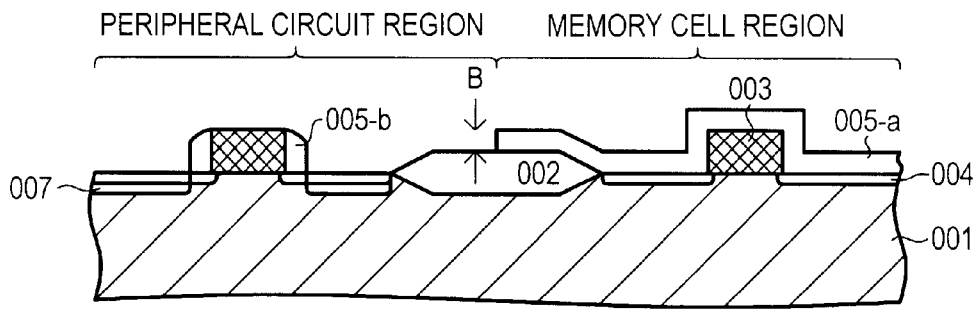

If reference is made back to the related art of FIG. 7, it will be recalled that a step height "B" can vary according to a sidewall thickness. For example, a resulting step height B can be essentially the same as the thickness of a resulting sidewall 005-*b* formed in a PERIPHERAL CIRCUIT REGION. As previously noted, such a difference in height can adversely reduce focus margin for subsequent photolithographic steps. For example, photolithographic steps used to pattern a bit line may be adversely affected.

Figure 5:
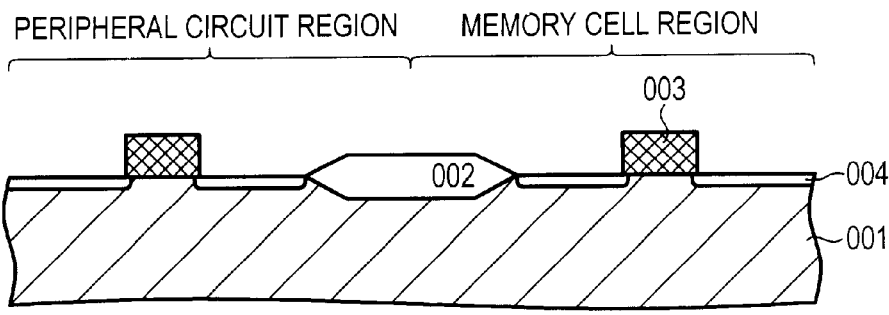
FIGS. 5 to 7 are side cross sectional views of art related to the present invention.
Figure 6:
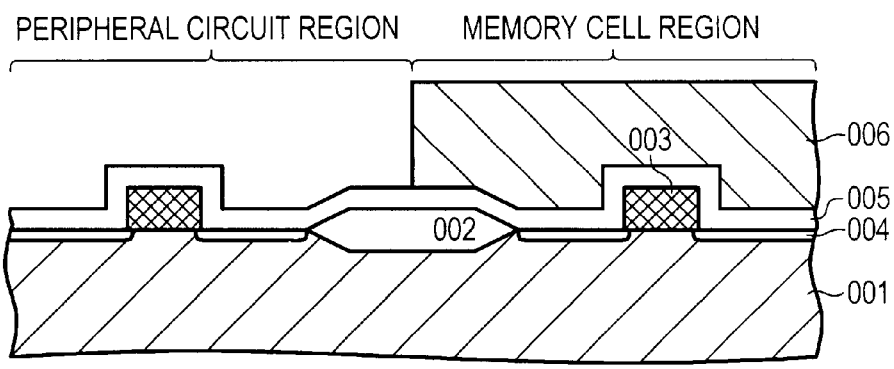

In contrast, according to the present invention, a first region protective film 105-*a* and sidewall film 107 may be formed separately. This can allow a first region protective film 105-*a* to protect a MEMORY CELL REGION from etch damage, rather, than a sidewall film 107. Because a first region protective film 105-*a* can be considerably thinner than a sidewall film 107, a step height "A" between MEMORY CELL REGION and a PERIPHERAL CIRCUIT REGION can be greatly reduced (e.g., 400 to 500 angstroms). Such a height difference reduction can improve focus margins for subsequent photolithographic techniques over conventional approaches, such as that shown in FIGS. 5–7. Such subsequent photolithographic techniques may be used to form bit lines, for example.

Referring back to FIG. 1, a method according to the present invention may continue with the formation of second diffusion regions 108. In one particular arrangement, second diffusion regions 108 may be formed by implanting ions, such as arsenic or difluoroborane, to form n-type and/or p-type second diffusion regions 108. Such second diffusion regions 108 may form part, or all of various transistor source and drain regions. Forming second diffusion regions 108 may also include masking portions of a semiconductor device using conventional photolithographic techniques.

The above description has shown a manufacturing method for a semiconductor device that may include forming an isolation region and gate on a semiconductor substrate. A protective film may be formed over a first region (e.g., a memory cell region) and not over a second region (e.g., a peripheral circuit region). In one arrangement, photolithographic and isotropic wet etching can form the protective film over the first region. A sidewall film may then be formed over a first region and second regions, and etched to form sidewalls on transistor gate structures.

Etching damage in a first region can be prevented by the addition of a protective film. Further, because a protective film can be considerably thinner than a sidewall film, a step height difference between a first region and a second region can be reduced, improving focus margin for a subsequent photolithographic step.

One reason the above effects can be achieved is that protective film and a sidewall film may be formed separately. Further, the thickness of a protective film can be 400 to 500 angstroms.

It is understood that while the various embodiments have mentioned a particular semiconductor device type (e.g., a memory device, or more particularly a DRAM), the present invention should not be construed as being limited thereto.

For example, the teachings set forth herein may be applied to other types of semiconductor devices having one or more regions where reductions in etch damage are desired.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of manufacturing a semiconductor device, comprising the steps of:
    forming isolation regions in a semiconductor substrate;
    forming a gate over a first region of the semiconductor substrate;
    forming first impurity diffusion regions in the semiconductor substrate;
    forming a first region protective film after forming first impurity diffusion regions by depositing the protective film over the first region and a second region of the semiconductor substrate and removing portions of the protective film over the second region by isotropic etching;
    forming a sidewall layer over the first and second regions;
    etching the sidewall layer to form sidewalls on the gate; and
    forming second impurity diffusion regions.
2. The method of claim 1, wherein:
    the step of forming the first region protective film includes masking the first region using photolithographic techniques.
3. The method of claim 1, wherein:
    the first diffusion regions include lightly doped diffusion (LDD) regions.
4. The method of claim 3, wherein:
    the LDD regions are n-type regions formed in the first region.
5. The method of claim 1, wherein:
    the isotropic etching includes a wet chemical etch.
6. The method of claim 5, wherein:
    the protective film comprises silicon dioxide.
7. The method of claim 1, wherein:
    the first region is a memory cell region in which memory cells are formed; and
    the second region is a peripheral circuit region in which peripheral circuit transistors are formed.
8. The method of claim 1, wherein:
    the protective film has a thickness in the range of 400 to 500 angstroms.
9. The method of claim 1 wherein, wherein:
    the protective film and sidewall layer comprise silicon dioxide and are formed separately from one another.
10. The method of claim 1, wherein:
    the first impurity diffusion region is self-aligned with the gate.
11. The method of claim 1, wherein:
    the gate is a semiconductor memory device word line.
12. The method of claim 1, wherein:
    a step height between the first region and the second region following the formation of gate sidewalls is less than 600 angstroms without chemical-mechanical polishing.
13. A method, comprising the steps of:
    forming a protective film comprising an undoped layer of silicon dioxide over a first region having first transistor gates and over a second region having second transistor gates;
    removing the protective film over the second region and retaining the protective film over the first region;
    forming a sidewall layer over the first region and the second region; and
    etching the sidewall layer to form sidewalls on the first transistor gates the second transistor gates and retaining at least a portion of the protective film over the first region.
14. The method of claim 13, wherein:
    forming the protective film includes depositing a layer of silicon dioxide having a thickness in the range of 400 to 500 angstroms.
15. The method of claim 13, wherein:
    removing the protective film over the second region and retaining the protective film over the first region includes
        forming an etch mask over the first region that covers the protective film over the first region and exposes the protective film over the second region, and
        isotropically etching the exposed protective film.
16. The method of claim 13, wherein:
    the first region comprises a memory cell region in which a plurality of memory cells are formed; and
    the second region comprises a circuit region peripheral to the memory cell region.
17. A method, comprising the steps of:
    protecting a memory cell region substrate of a semiconductor memory device from etch damage by forming a protective film over the memory cell region and removing the protective film from a peripheral circuit region before depositing and etching a gate sidewall layer to form insulating sidewalls on gates in the memory cell region and peripheral circuit region, the protective film being formed after diffusion regions are formed in the memory cell region.
18. The method of claim 17, wherein:
    the semiconductor memory device is a dynamic random access memory; and
    etching the gate sidewall layer forms sidewalls on word lines in the memory cell region that are formed adjacent to n-type diffusion regions.
19. The method of claim 17, wherein:
    removing the protective film from a peripheral circuit region include isotropically etching a protective film comprising silicon dioxide; and
    etching a gate sidewall layer include anisotropically etching a sidewall layer comprising silicon dioxide.
20. The method of claim 17, wherein:
    the thickness of the protective film is no more than one third the thickness of the sidewall layer.

* * * * *